(12) United States Patent
Loftsgaarden et al.

(10) Patent No.: US 11,451,415 B2
(45) Date of Patent: Sep. 20, 2022

(54) CIRCUITRY FOR INCREASING BANDWIDTH AND REDUCING INTERFERENCE IN MEMORY SIGNALS

(71) Applicant: Micron Technology, Inc., Boise, ID (US)

(72) Inventors: Taylor Loftsgaarden, Eden Prairie, MN (US); Ming-ta Hsieh, Woodbury, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/817,764

(22) Filed: Mar. 13, 2020

(65) Prior Publication Data

US 2021/0288844 A1    Sep. 16, 2021

(51) Int. Cl.
| | | |
|---|---|---|
| G06F 12/00 | (2006.01) |
| G06F 13/00 | (2006.01) |
| G06F 13/28 | (2006.01) |
| H04L 25/03 | (2006.01) |
| G06F 12/06 | (2006.01) |
| G06F 13/16 | (2006.01) |
| G06F 11/00 | (2006.01) |
| G06F 3/041 | (2006.01) |

(52) U.S. Cl.
CPC .... H04L 25/03057 (2013.01); G06F 3/04182 (2019.05); G06F 11/002 (2013.01); G06F 12/06 (2013.01); G06F 13/1668 (2013.01)

(58) Field of Classification Search
CPC ... G06F 3/0418; G06F 11/002; G06F 3/04182

USPC .......................................................... 711/101
See application file for complete search history.

(56) References Cited

U.S. PATENT DOCUMENTS

| | | | |
|---|---|---|---|
| 9,215,114 B2 | 12/2015 | Emami-Neyestanak et al. | |
| 10,325,635 B2 | 6/2019 | Grunzke | |
| 2002/0118291 A1* | 8/2002 | Ishigami | H04N 5/335 348/311 |
| 2004/0125521 A1* | 7/2004 | Sailing | H01L 27/0285 361/56 |
| 2005/0002479 A1* | 1/2005 | Tripathi | H03H 21/0001 375/345 |
| 2005/0253647 A1* | 11/2005 | Hagari | H03H 11/1291 327/554 |
| 2011/0144950 A1* | 6/2011 | Lieberman | G06F 11/348 702/188 |
| 2017/0063348 A1 | 3/2017 | Sadd, III et al. | |
| 2018/0351769 A1 | 12/2018 | Tajalli et al. | |

(Continued)

OTHER PUBLICATIONS

International Search Report and Written Opinion from related PCT Application No. PCT/US2021/017655, dated Jun. 4, 2021, 9 pages.

(Continued)

*Primary Examiner* — Edward J Dudek, Jr.
*Assistant Examiner* — Sidney Li
(74) *Attorney, Agent, or Firm* — Brooks, Cameron & Huebsch, PLLC (57) ABSTRACT

Signals sent to a memory component are received by circuitry included in the memory component. The circuitry comprises a comparator circuit to process the received signals. The circuitry further comprises a resistor-capacitor (RC) circuit coupled to the comparator circuit to increase bandwidth and reduce interference in the received signals processed by the comparator circuit.

17 Claims, 5 Drawing Sheets

(56) References Cited

U.S. PATENT DOCUMENTS

2019/0158322 A1    5/2019   Kimura et al.
2019/0229683 A1    7/2019   Motoroiu et al.
2019/0356517 A1   11/2019   Sreeramaneni et al.

OTHER PUBLICATIONS

Office Action from related Taiwan Patent Application No. 110107711, dated Dec. 30, 2021, 17 pages.

* cited by examiner

CIRCUITRY FOR INCREASING BANDWIDTH AND REDUCING INTERFERENCE IN MEMORY SIGNALS

TECHNICAL FIELD

Embodiments of the disclosure relate generally to memory sub-systems, and more specifically, relate to circuitry for increasing bandwidth and reducing interference, such as inter-symbol interference (ISI) in memory signals.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to circuitry for increasing bandwidth and reducing interference in memory signals. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components (also hereinafter referred to as "memory devices"). The host system can provide data to be stored at the memory sub-system and can request data to be retrieved from the memory sub-system.

During operation of a memory sub-system, a memory component of the memory sub-system may receive and process signals (e.g., control signals) sent to the memory component by a processing device of the memory sub-system. Such signals may be utilized by the memory component in programming data (e.g., data provided by a host system) to the memory component for storage at the memory component, and/or in sensing data stored at the memory component, for example. However, such signals may include interference, such as, for instance, inter-symbol interference (ISI), that can reduce the signal received by the memory component. This interference may result from, for example, channel loss (e.g., high frequency channel loss) that may occur while the signal is in transit from the processing device to the memory component. Further, at higher data rates in a given signal processing technology, internal nodes of a receiver architecture can be bandwidth limited.

The memory component of a conventional memory sub-system may include a receiver (e.g., single-ended or differential) with a comparator circuit to receive and process the signals from the processing device of the memory sub-system. However, such a receiver may not reduce ISI of the signal that results from channel loss, and may have frequency limitations. To reduce this interference, conventional memory sub-systems may use a current mode logic (CIVIL) buffer with a source degenerated frequency peaking. However, it can be difficult to create a center tap termination compatible comparator in CIVIL logic, given technology and supply constraints, due to the difficulty of adding signals, from NMOS and PMOS differential pairs, back together in a CML topology.

Aspects of the present disclosure address the above and other deficiencies by coupling (e.g., adding) a frequency-peaking resistor-capacitor (RC) circuit to a comparator circuit (e.g., to the load of the comparator circuit) at the interface (e.g., receiver) of the memory component of the memory sub-system. Such an RC circuit can reduce the interference (e.g., ISI) in the signals received from the processing device of the memory sub-system, including interference that may result from channel loss. Further, such an RC circuit can increase the speed at which the received signals are processed by the memory component by, for instance, increasing the speed of the signals within the comparator circuit. For example, such an RC circuit may increase the speed at which the received signals are processed by increasing the maximum data rate operation of the comparator circuit.

Figure 1:
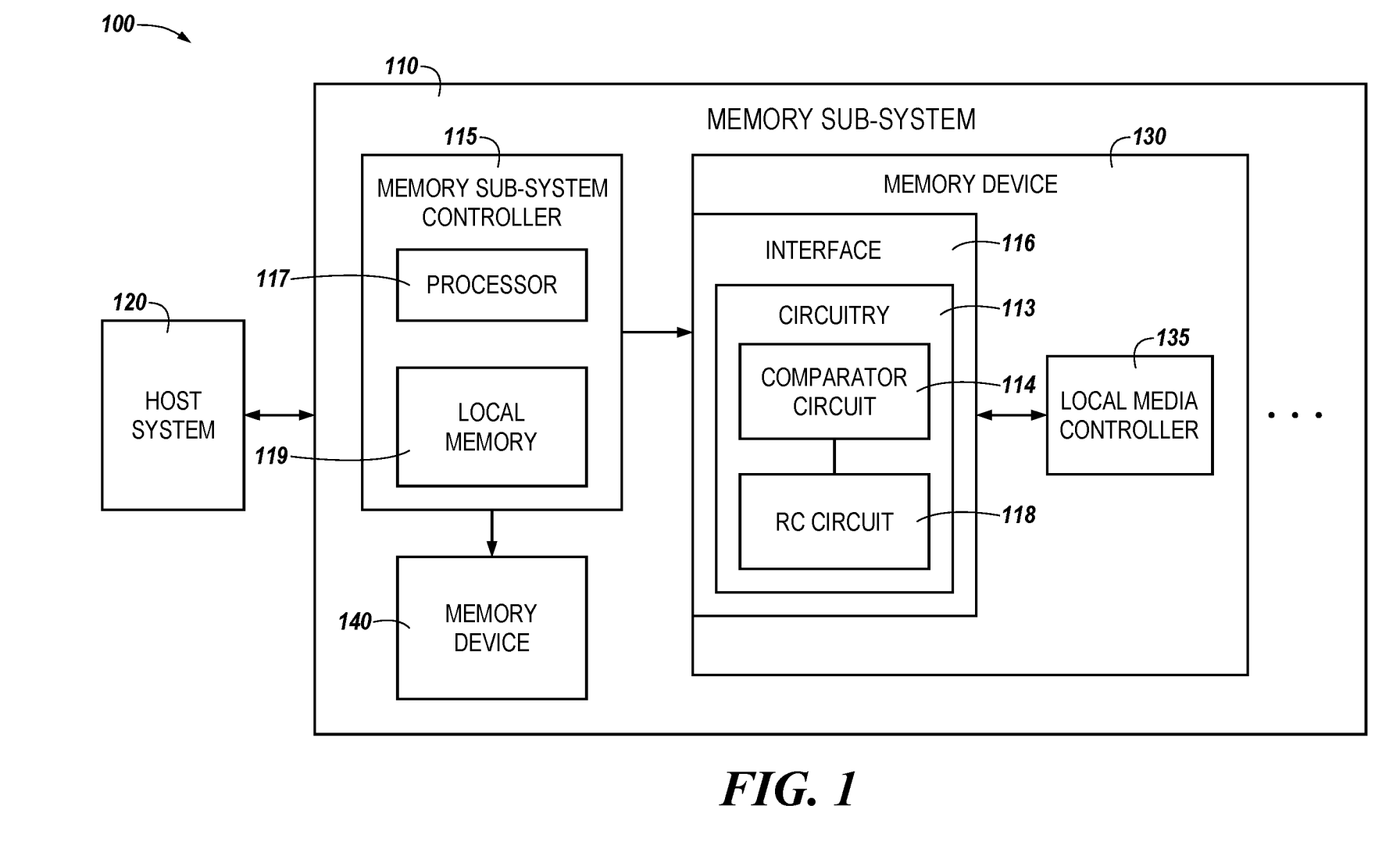
FIG. 1 illustrates an example computing system that includes a memory sub-system in accordance with some embodiments of the present disclosure.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes a memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, an Open NAND Flash Interface (ONFI), a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a dual in-line memory module (DIMM) interface (e.g., DIMM socket interface that supports Double Data Rate (DDR)), a Universal Flash Storage (UFS), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory, such as three-dimensional cross-point ("3D cross-point") device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory components 130 can include one or more arrays of memory cells. Once type of memory cell, for example, single level cells (SLCs) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include both an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type memory (e.g., 2D NAND, 3D NAND) are described, the memory device 130 can be based on any other type of non-volatile memory or storage device, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory RRAM, oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (e.g., hard-coded) logic to perform the operations described herein. The controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory device 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory device 110 includes an interface 116 having circuitry 113. Interface 116 (e.g., circuitry 113) can receive signals (e.g., control signals and/or instructions) sent to memory device 130 from memory sub-system controller 115 (e.g., from processor 117) to access memory device 130. For example, one end of a bus can be coupled to memory sub-system controller 115, and the other end of the bus can be coupled to interface 116, and controller 115 can send the signals to memory device 130 via the bus. In some embodiments, the bus can comprise one or more connectors coupled via one or more wires. The signals may comprise, for instance, voltage signals utilized by memory device 130 in programming data (e.g., provided by host system 120) to memory device 130 (e.g., to the memory cells of memory device 130) for storage at memory device 130, and/or in sensing data stored at memory device 130 (e.g., data stored in the memory cells of memory device 130).

Circuitry 113 can reduce interference, such as, for instance, inter-symbol interference (ISI) and/or interference resulting from channel loss (e.g. high frequency channel loss), in the signals sent to memory device 130. Further, circuitry 113 can increase bandwidth in the signals. For instance, circuitry 113 can increase the speed at which the signals are processed by memory device 130.

For example, as shown in FIG. 1, circuitry 113 includes a comparator circuit 114, and a resistor-capacitor (RC) circuit (e.g., RC peaking circuit) 118 coupled to comparator circuit 114 (e.g., to the load of comparator circuit 114). Comparator circuit 114 can process the signals sent to (e.g., received by) memory device 130. For example, comparator circuit 114 can compare the signals to a reference signal (e.g., a reference voltage), and output a signal indicating the result of the comparison (e.g., indicating whether the received voltage signal is larger than the reference voltage) to local media controller 135. As an additional example, a complementary signal could be used instead of a reference voltage. An example of comparator circuit 114 will be further described herein (e.g., in connection with FIGS. 2-3).

RC peaking circuit 118 can reduce interference (e.g., ISI and/or channel loss interference) in the signals processed by comparator circuit 114. Further, RC peaking circuit 118 can increase bandwidth in the signals. For instance, integrating an RC peaking circuit 118 can increase the speed at which comparator circuit 114 processes the signals (e.g., increase the speed of the signals within comparator circuit 114) by increasing the maximum data rate operation of comparator circuit 114. An example of RC circuit 118 will be further described herein.

Figure 2:
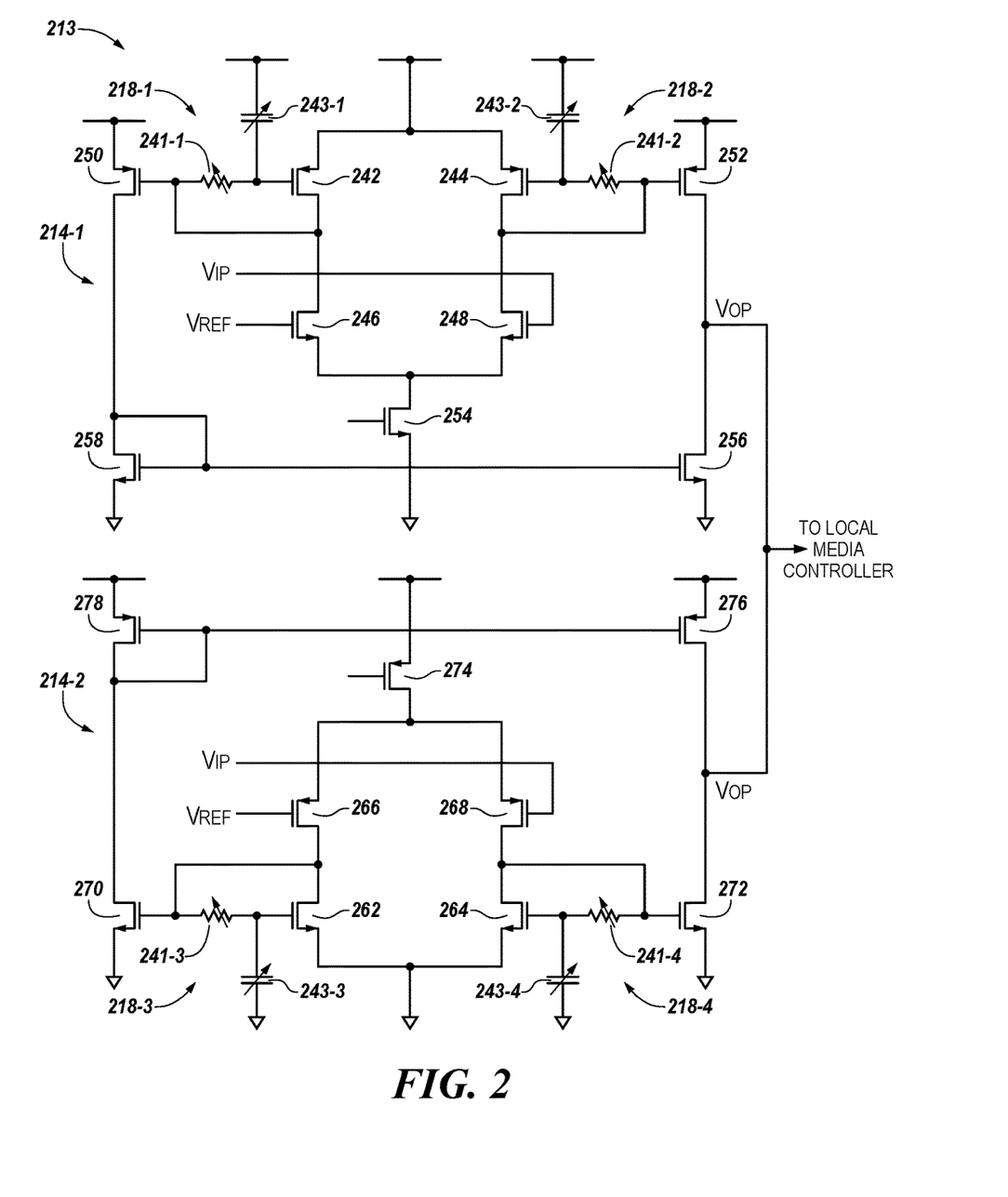
FIG. 2 illustrates example circuitry for increasing bandwidth and reducing interference in memory signals in accordance with some embodiments of the present disclosure.

FIG. 2 illustrates example circuitry 213 for increasing bandwidth and reducing interference in memory signals in accordance with some embodiments of the present disclosure. Circuitry 213 can be, for instance, circuitry 113 of memory device 130 previously described in connection with FIG. 1.

As shown in FIG. 2, circuitry 213 includes a first comparator circuit 214-1 and a second comparator circuit 214-2. That is, comparator circuit 114 previously described in connection with FIG. 1 can comprise comparator circuits 214-1 and 214-2. Such a topology can provide good electrical performance for the input signal across a wide range of common mode voltage. Comparator circuit 214-1 can provide most of the signal strength when $V_{IP}$ signal shown in FIG. 2 is greater than $V_{REF}$ signal shown in FIG. 2, and comparator circuit 214-2 can provide most of the signal strength when $V_{IP}$ is less than $V_{REF}$. These two signals can be added back together at node $V_{OP}$ shown in FIG. 2.

As shown in FIG. 2, comparator circuit 214-1 can include transistors 242, 244, 246, 248, 250, 252, 254, 256, and 258, which can each be metal-oxide-semiconductor field-effect transistors (MOSFETs). For instance, as illustrated in FIG. 2, the source of p-type MOS (PMOS) transistor 242 can be coupled to the source of PMOS transistor 244 to supply, and the drain of PMOS transistor 242 can be coupled to the drain of n-type MOS (NMOS) transistor 246 and the gate of PMOS transistor 250. Further, the drain of PMOS transistor 244 can be coupled to the drain of NMOS transistor 248 and the gate of PMOS transistor 252, and the source of NMOS transistor 246 can be coupled to the source of NMOS transistor 248. Further, the sources of NMOS transistors 246 and 248 can each be coupled to the drain of NMOS transistor 254, and the source of NMOS transistor 254 can be coupled to ground. Further, the drain of PMOS transistor 250 can be coupled to the drain and gate of NMOS transistor 258, the source of NMOS transistor 258 can be coupled to ground, and the gate of NMOS transistor 258 can be coupled to the gate of NMOS transistor 256. Further, the source of NMOS transistor 256 can be coupled to ground, and the drain of NMOS transistor 256 can be coupled to the drain of PMOS transistor 252.

As shown in FIG. 2, comparator circuit 214-2 can include transistors 262, 264, 266, 268, 270, 272, 274, 276, and 278, which can each be MOSFETs. For instance, as illustrated in FIG. 2, the source of NMOS transistor 262 can be coupled to the source of NMOS transistor 264 and ground, and the drain of NMOS transistor 262 can be coupled to the drain of PMOS transistor 266 and the gate of NMOS transistor 270. Further, the drain of NMOS transistor 264 can be coupled to the drain of PMOS transistor 268 and the gate of NMOS transistor 272, and the source of PMOS transistor 266 can be coupled to the source of PMOS transistor 268. Further, the sources of PMOS transistors 266 and 268 can each be coupled to the drain of PMOS transistor 274. Further, the source of NMOS transistor 270 can be coupled to ground, the drain of NMOS transistor 270 can be coupled to the drain and gate of PMOS transistor 278, and the gate of PMOS transistor 278 can be coupled to the gate of PMOS transistor 276. Further, the drain of PMOS transistor 276 can be coupled to the drain of NMOS transistor 272, and the source of NMOS transistor 272 can be coupled to ground. Further, the $V_{OP}$ nodes of comparator circuits 214-1 and 214-2 can be connected together to sum together the two output signals of the individual comparator circuits.

Comparator circuits 214-1 and 214-2 can process signals received by memory device 130. For example, comparator circuits 214-1 and 214-2 can compare the signals to a reference signal, and output a signal indicating the result of the comparison to local media controller 135.

For example, as shown in FIG. 2, voltage signals (e.g., $V_{IP}$) received by memory device 130 can be coupled (e.g. input) to the gate of NMOS transistor 248 and to the gate of PMOS transistor 268. Further, a reference voltage signal (e.g., $V_{REF}$) can be coupled (e.g., input) to the gate of NMOS transistor 246 and to the gate of PMOS transistor 266, as illustrated in FIG. 2. The reference voltage signal coupled to transistor 246 may be the same as, or different than, the reference voltage signal coupled to transistor 266. Comparator circuit 214-1 can compare the $V_{IP}$ input to transistor 248 to the $V_{REF}$ input to transistor 246 to determine whether the $V_{IP}$ is larger than the $V_{REF}$, and output a voltage signal (e.g., $V_{OP}$) indicating the result of the comparison (e.g., indicating whether the $V_{IP}$ is larger than the $V_{REF}$) to local media controller 135, as illustrated in FIG. 2. Similarly, comparator circuit 214-2 can compare the $V_{IP}$ input to transistor 268 to the $V_{REF}$ input to transistor 266 to determine whether the $V_{IP}$ is larger than the $V_{REF}$, and output a voltage signal (e.g., $V_{OP}$) indicating the result of the comparison (e.g., indicating whether the $V_{IP}$ is larger than the $V_{REF}$) to local media controller 135, as illustrated in FIG. 2.

As shown in FIG. 2, circuitry 213 includes a first RC circuit 218-1 and a second RC circuit 218-2 coupled to comparator circuit 214-1 (e.g., to the load of comparator circuit 214-1), and a third RC circuit 218-3 and a fourth RC circuit 218-4 coupled to comparator circuit 214-2 (e.g., to the load of comparator circuit 214-2). That is, RC circuit 118 previously described in connection with FIG. 1 can comprise RC circuits 218-1, 218-2, 218-3, and 218-4.

As shown in FIG. 2, RC circuit 218-1 can include a resistor 241-1 and capacitor 243-1 coupled in series, RC circuit 218-2 can include a resistor 241-2 and capacitor 243-2 coupled in series, RC circuit 218-3 can include a resistor 241-3 and capacitor 243-3 coupled in series, and RC circuit 218-4 can include a resistor 241-4 and capacitor 243-4 coupled in series. That is, RC circuits 218-1, 218-2, 218-3, and 218-4 can each be a series RC circuit.

In the example illustrated in FIG. 2, resistors 241-1, 241-2, 241-3, and 241-4 can each be an adjustable (e.g., adaptable and/or variable) resistor, and capacitors 243-1, 243-2, 243-3, and 243-4 can each be an adjustable capacitor. For instance, the resistance of resistors 241-1, 241-2, 241-3, and 241-4 and the capacitance of capacitors 243-1, 243-2, 243-3, and 243-4 may be adjusted during operation of memory device 130 by memory sub-system controller 115. Embodiments of the present disclosure, however, are not so limited. For instance, in some embodiments, resistors 241-1, 241-2, 241-3, and 241-4 can each be a fixed resistor, and/or capacitors 243-1, 243-2, 243-3, and 243-4 can each be a fixed capacitor (e.g., the resistance of the resistors and/or the capacitance of the capacitors may not be adjustable).

As shown in FIG. 2, RC circuit 218-1 can be coupled to the gate of PMOS transistor 242, and RC circuit 218-2 can be coupled to the gate of PMOS transistor 244. Further, resistor 241-1 of RC circuit 218-1 can be coupled to the gate of PMOS transistor 250, capacitor 243-1 of RC circuit 218-1 can be coupled to supply, resistor 241-2 of RC circuit 218-2 can be coupled to the gate of PMOS transistor 252, and capacitor 243-2 of RC circuit 218-2 can be coupled to supply, as illustrated in FIG. 2.

As shown in FIG. 2, RC circuit 218-3 can be coupled to the gate of NMOS transistor 262, and RC circuit 218-4 can be coupled to the gate of NMOS transistor 264. Further, resistor 241-3 of RC circuit 218-3 can be coupled to the gate of NMOS transistor 270, capacitor 243-3 of RC circuit 218-3 can be coupled to ground, resistor 241-4 of RC circuit 218-4 can be coupled to the gate of NMOS transistor 272, and capacitor 243-4 of RC circuit 218-4 can be coupled to ground, as illustrated in FIG. 2.

RC circuits 218-1 and 218-2 can reduce interference (e.g., ISI and/or channel loss interference) in the signals processed by comparator circuit 214-1, and RC circuits 218-3 and 218-4 can reduce interference in the signals processed by comparator circuit 214-2. For example, RC circuits 218-1 and 218-2 can serve as a frequency-peaking circuit that provides a path at the load of comparator circuit 214-1 to reduce the interference in the signals processed by comparator circuit 214-1. Similarly, RC circuits 218-3 and 218-4 can serve as a frequency-peaking circuit that provides a path at the load of comparator circuit 214-2 to reduce the interference in the signals processed by comparator circuit 214-2.

Further, RC circuits 218-1 and 218-2 can increase the speed at which comparator circuit 214-1 processes signals (e.g., RC circuits 218-1 and 218-2 can increase the speed of the signals within comparator circuit 214-1), and RC circuits 218-3 and 218-4 can increase the speed at which comparator circuit 214-2 processes signals (e.g., RC circuits 218-3 and 218-4 can increase the speed of the signals within comparator circuit 214-2). For example, RC circuits 218-1 and 218-2 can increase the maximum data rate operation of comparator circuit 214-1, and RC circuits 218-3 and 218-4 can increase the maximum data rate operation of comparator circuit 214-2.

RC circuits 218-1 and 218-2 can increase the speed at which comparator circuit 214-1 processes the signals, and thereby increase the bandwidth in the signals, utilizing transistors 242 and 244, respectively, and RC circuits 218-3 and 218-4 can increase the speed at which comparator circuit 214-2 processes the signals, and thereby increase the bandwidth in the signals, utilizing transistors 262 and 264, respectively. For instance, with regard to RC circuit 218-1 and transistor 242, for low frequency signals RC circuit 218-1 can result in a diode connected load at transistor 242, which can result in the same low frequency gain as the load would have by omitting RC circuit 218-1. However, for high frequency signals, RC circuit 218-1 can provide a DC operating voltage on the gate of transistor 242, RC circuit 218-1 can filter the high frequency signals, and transistor 242 can appear as a larger impedance current source. This increased gain at the higher frequencies can be the source of the peaking that increases the bandwidth of the internal node shown in FIG. 2 between the drains of transistors 246 and 242 and the gate of transistor 250, which may often be the slowest node in comparator circuit 214-1, as well as the node most susceptible to ISI. An analogous description can also be extended to RC circuit 218-2 and transistor 244, to RC circuit 218-3 and transistor 262, and to RC circuit 218-4 and transistor 264.

Figure 3:
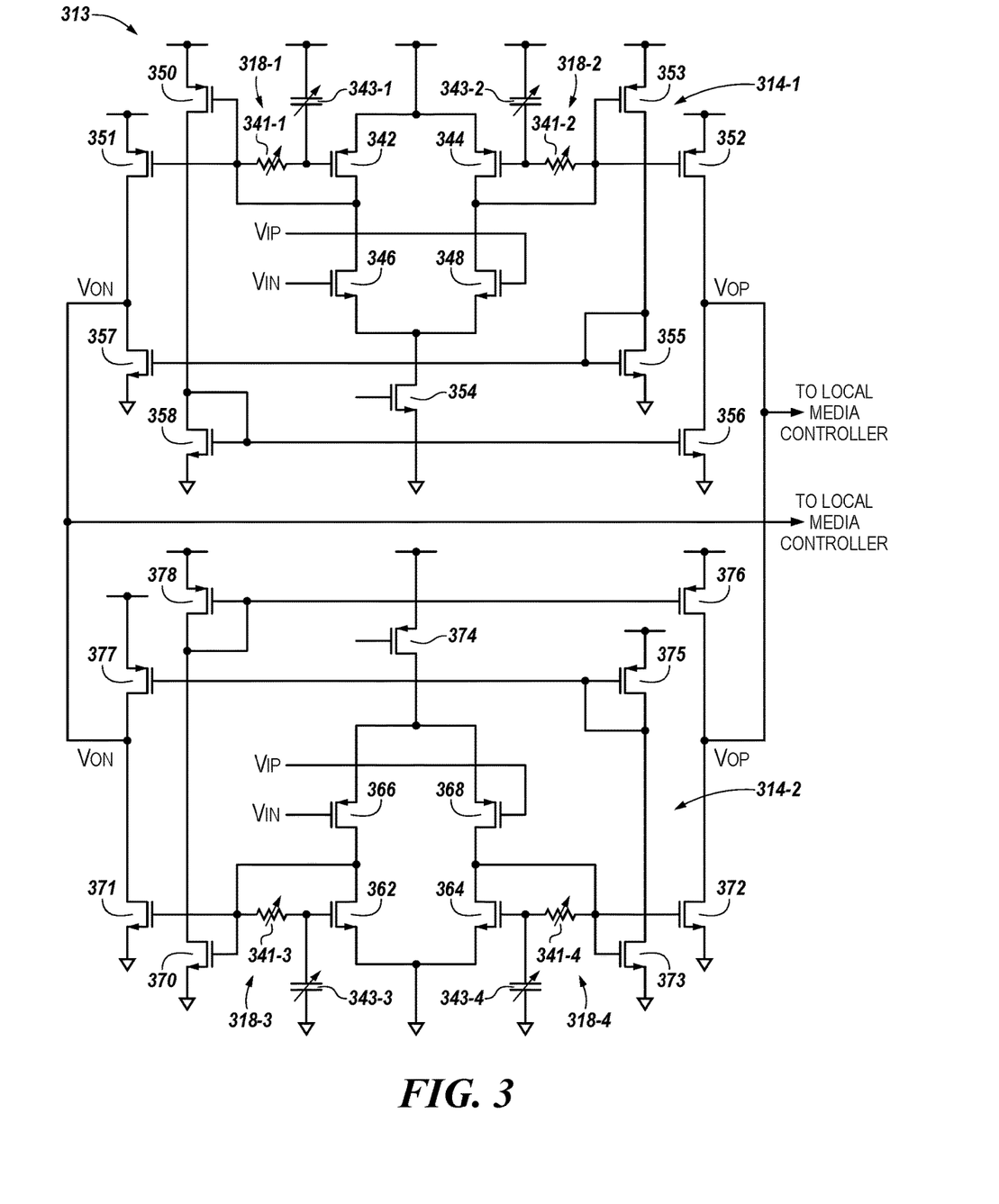
FIG. 3 illustrates example circuitry for increasing bandwidth and reducing interference in memory signals in accordance with some embodiments of the present disclosure.

FIG. 3 illustrates example circuitry 313 for increasing bandwidth and reducing interference in memory signals in accordance with some embodiments of the present disclosure. Circuitry 313 can be, for instance, an additional example of circuitry 113 of memory device 130 previously described in connection with FIG. 1. For example, circuitry 313 can be used if memory device 130 includes a differential receiver. That is, circuitry 313 can be used for differential signaling (e.g., for increasing bandwidth and reducing interference in differential memory signals).

As shown in FIG. 3, circuitry 313 includes a first comparator circuit 314-1 and a second comparator circuit 314-2. That is, comparator circuit 114 previously described in connection with FIG. 1 can comprise comparator circuits 314-1 and 314-2, in a manner analogous to that previously described for comparator circuits 214-1 and 214-2 in connection with FIG. 2.

As shown in FIG. 3, comparator circuit 314-1 can include transistors 342, 344, 346, 348, 350, 352, 354, 356, and 358, in a manner analogous to transistors 242, 244, 246, 248, 250, 252, 254, 256, and 258 of comparator circuit 214-1 previously described in connection with FIG. 2. Further, comparator circuit 314-2 can include transistors 362, 364, 366, 368, 370, 372, 374, 376, and 378, in a manner analogous to transistors 262, 264, 266, 268, 270, 272, 274, 276, and 278 of comparator circuit 214-2 previously described in connection with FIG. 2.

As shown in FIG. 3, comparator circuit 314-1 can also include transistors 351, 353, 355, and 357, which can each be MOSFETs. For instance, as illustrated in FIG. 3, the drain of PMOS transistor 351 can be coupled to the drain of NMOS transistor 357, the source of NMOS transistor 357 can be coupled to ground, and the gate of NMOS transistor 357 can be coupled to the gate and drain of NMOS transistor 355. Further, the source of NMOS transistor 355 can be coupled to ground, and the drain of NMOS transistor 355 can be coupled to the drain of PMOS transistor 353.

As shown in FIG. 3, comparator circuit 314-2 can also include transistors 371, 373, 375, and 377, which can each be MOSFETs. For instance, as illustrated in FIG. 3, the source of NMOS transistor 371 can be coupled to ground, the drain of NMOS transistor 371 can be coupled to the drain of PMOS transistor 377, and the gate of PMOS transistor 377 can be coupled to the gate and drain of PMOS transistor 375. Further, the drain of PMOS transistor 375 can be coupled to the drain of NMOS transistor 373, and the source of NMOS transistor 373 can be coupled to ground. Further, the $V_{OP}$ nodes of comparator circuits 314-1 and 314-2 can be connected together, and the $V_{ON}$ nodes of comparator circuits 314-1 and 314-2 can be connected together, as illustrated in FIG. 3.

Comparator circuits 314-1 and 314-2 can process signals received by memory device 130. For example, as shown in FIG. 3, voltage signals (e.g., \Tip) received by memory device 130 can be coupled to the gate of NMOS transistor 348 and to the gate of PMOS transistor 368, and a voltage signal VIN can be coupled to the gate of NMOS transistor 346 and to the gate of PMOS transistor 366. Comparator circuits 314-1 and 314-2 can compare the $V_{IPS}$ to the $V_{INS}$, and output voltage signals (e.g., $V_{OP}$ and $V_{ON}$) indicating the result of the comparison in a manner analogous to that previously described in connection with FIG. 2.

As shown in FIG. 3, circuitry 313 includes a first RC circuit 318-1 and a second RC circuit 318-2 coupled to comparator circuit 314-1, and a third RC circuit 318-3 and a fourth RC circuit 318-4 coupled to comparator circuit 314-2. That is, RC circuit 118 previously described in connection with FIG. 1 can comprise RC circuits 318-1, 318-2, 318-3, and 318-4, in a manner analogous to that previously described for RC circuits 218-1, 218-2, 218-3, and 218-4 in connection with FIG. 2. For example, RC circuit 318-1 can include a resistor 341-1 and capacitor 343-1 coupled in series in a manner analogous to RC circuit 218-1, RC circuit 318-2 can include a resistor 341-2 and capacitor 343-2 coupled in series in a manner analogous to RC circuit 218-2, RC circuit 318-3 can include a resistor 341-3 and capacitor 343-3 coupled in series in a manner analogous to RC circuit 218-3, and RC circuit 318-4 can include a resistor 341-4 and capacitor 343-4 coupled in series in a manner analogous to RC circuit 218-4.

RC circuits 318-1 and 318-2 can reduce interference in the signals processed by comparator circuit 314-1, and RC circuits 318-3 and 318-4 can reduce interference in the signals processed by comparator circuit 314-2, in a manner analogous to that previously described for RC circuits 218-1, 218-2, 218-3, and 218-4 in connection with FIG. 2. Further, RC circuits 318-1 and 318-2 can increase the speed at which comparator circuit 314-1 processes signals, and RC circuits 318-3 and 318-4 can increase the speed at which comparator circuit 314-2 processes signals, in a manner analogous to that previously described for RC circuits 218-1, 218-2, 218-3, and 218-4 in connection with FIG. 2.

Figure 4:
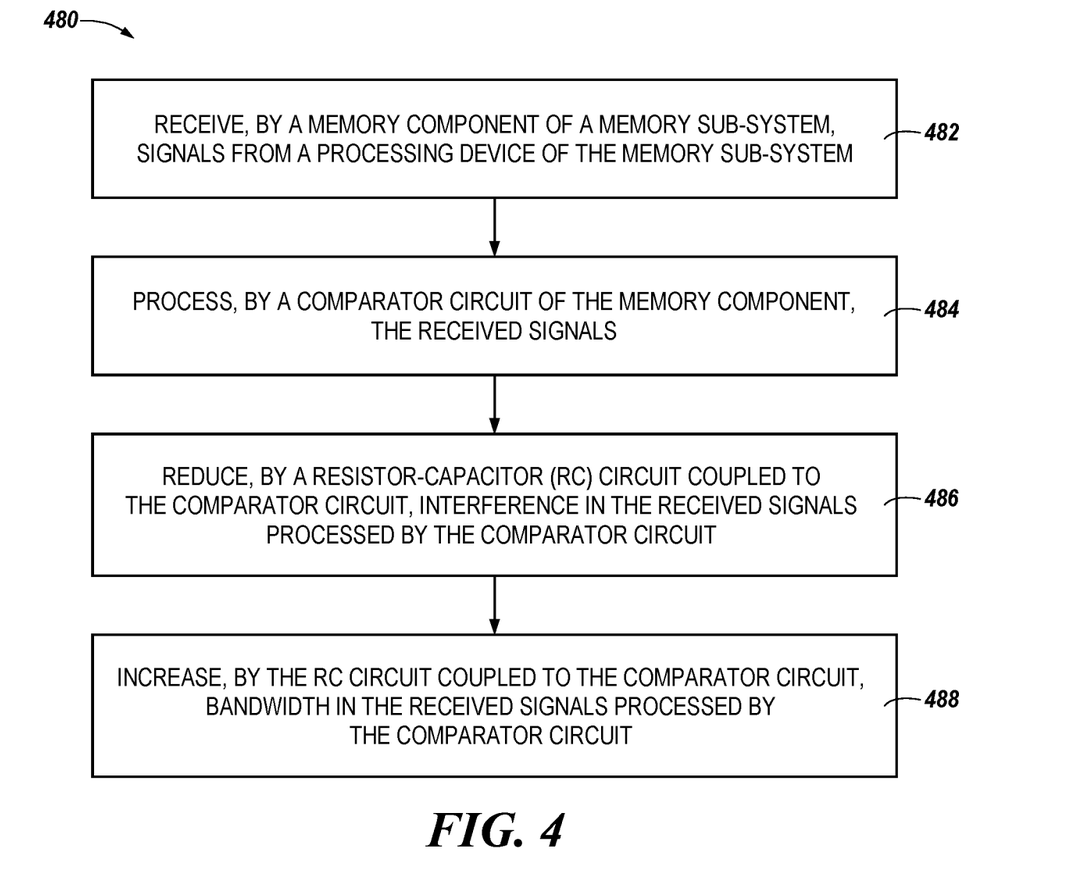
FIG. 4 is a flow diagram of an example method to increase bandwidth and reduce interference in memory signals in accordance with some embodiments of the present disclosure.

FIG. 4 is a flow diagram of an example method 480 to increase bandwidth and reduce interference in memory signals in accordance with some embodiments of the present disclosure. The method 480 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 380 is performed by circuitry 113 of memory device 130 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 482, a memory component of a memory sub-system receives signals from a processing device of the memory sub-system. The memory component, processing device, and memory sub-system can be, for example, memory device 130, processor 117, and memory sub-system 110, respectively, of FIG. 1. The signals can comprise, for instance, voltage signals utilized by memory device 130 in programming data to memory device 130 for storage and/or in sensing data stored at memory device 130, as previously described herein.

At block 484, a comparator circuit of the memory component processes the received signals. The comparator circuit can be, for example, comparator circuit 114 previously described in connection with FIG. 1, comparator circuits 214-1 and 214-2 previously described in connection with FIG. 2, and/or comparator circuits 314-1 and 314-2 previously described in connection with FIG. 3. Processing the received signals can include, for example, comparing the signals to a reference signal, and outputting a signal indicating the result of the comparison, as previously described herein.

At block 486, a resistor-capacitor (RC) circuit coupled to the comparator circuit reduces interference in the received signals processed by the comparator circuit. The RC circuit can be, for example, RC circuit 118 previously described in connection with FIG. 1, RC circuits 218-1, 218-2, 218-3, and 218-4 previously described in connection with FIG. 2, and/or RC circuits 318-1, 318-2, 318-3, and 318-4 previously described in connection with FIG. 3. The interference in the signals can include, for instance, ISI and/or channel loss interference, and can be reduced by the RC circuit in a manner as previously described herein.

At block 488, the RC circuit coupled to the comparator circuit increases bandwidth in the received signals processed by the comparator circuit. The bandwidth can be increased by, for example, increasing the speed at which the comparator circuit processes the signals, in a manner as previously described herein.

Figure 5:
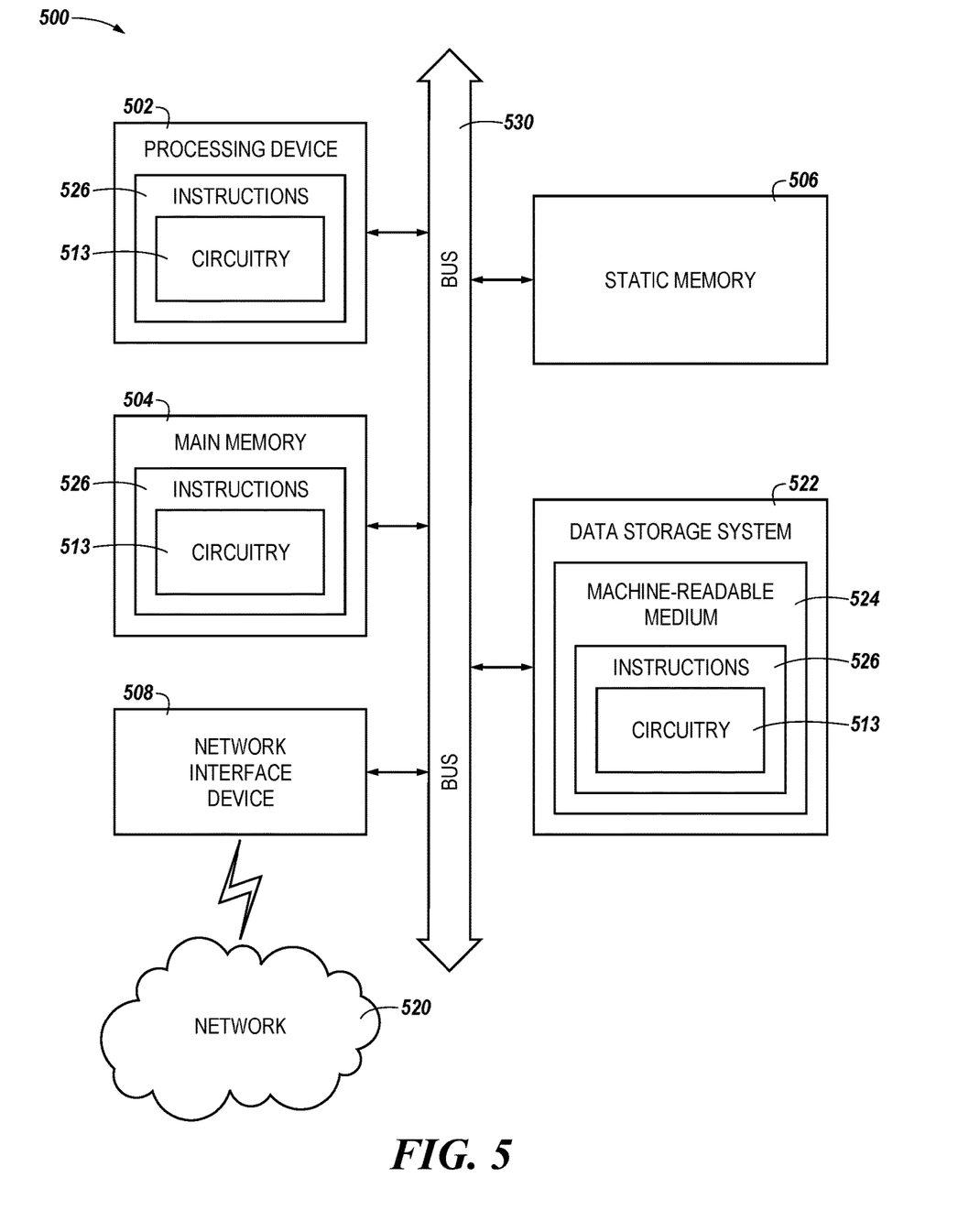
FIG. 5 is a block diagram of an example computer system in which embodiments of the present disclosure may operate.

FIG. 5 is a block diagram of an example computer system 500 in which embodiments of the present disclosure may operate. For example, FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the circuitry 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 522, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 522 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 522, and/or main memory 504 can correspond to the memory sub-system 110 of FIG. 1.

In one embodiment, the instructions 526 include instructions to implement functionality corresponding to circuitry 513 (e.g., the circuitry 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

As used herein, "a", "an", or "a number of" can refer to one or more of something, and "a plurality of" can refer to more than one of such things. For example, a memory device can refer to one or more memory devices, and a plurality of memory devices can refer to two or more memory devices.

The figures herein follow a numbering convention in which the first digit or digits correspond to the drawing figure number and the remaining digits identify an element or component in the drawing. Similar elements or components between different figures may be identified by the use of similar digits. For example, 113 may reference element "13" in FIG. 1, and a similar element may be referenced as 513 in FIG. 5.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system, comprising:
   a memory component; and
   circuitry included in the memory component to receive signals sent to the memory component, wherein the circuitry comprises:
   a comparator circuit to process the received signals, wherein the comparator circuit includes:
   a first transistor having a gate to which the received signals are coupled;
   a second transistor having a gate to which a reference signal is coupled; and
   a third transistor having a drain that is directly coupled to a drain of the first transistor; and a series resistor-capacitor (RC) circuit directly coupled to a gate of the third transistor of the comparator circuit to increase bandwidth and reduce interference in the received signals processed by the comparator circuit.

2. The system of claim 1, wherein the series RC circuit is to increase the bandwidth in the received signals by increasing a speed at which the comparator circuit process the received signals.

3. The system of claim 1, wherein the circuitry further comprises:
an additional series RC circuit directly coupled to a gate of a fourth transistor of the comparator circuit.

4. The system of claim 1, wherein the first transistor, the second transistor, and the third transistor each comprise a metal-oxide-semiconductor field-effect transistor (MOSFET).

5. The system of claim 1, wherein the circuitry further comprises:
an additional comparator circuit to process the received signals; and
an additional RC circuit coupled to the additional comparator circuit to increase bandwidth and reduce interference in the received signals processed by the additional comparator circuit.

6. A system, comprising:
a memory component; and
circuitry included in the memory component to receive signals sent to the memory component, wherein the circuitry comprises:
a comparator circuit to process the received signals, wherein the comparator circuit includes:
a first transistor having a gate to which the received signals are coupled;
a second transistor having a gate to which a reference signal is coupled; and
a third transistor having a drain that is directly coupled to a drain of the first transistor and a fourth transistor having a drain that is directly coupled to a drain of the second transistor;
a first series resistor-capacitor (RC) circuit directly coupled to a gate of the third transistor of the comparator circuit; and
a second series RC circuit directly coupled to a gate of the fourth transistor of the comparator circuit;
wherein the first series RC circuit and the second series RC circuit are to increase bandwidth and reduce interference in the received signals processed by the comparator circuit.

7. The system of claim 6, wherein the circuitry further comprises:
an additional comparator circuit to process the received signals;
a third RC circuit coupled to the additional comparator circuit; and
a fourth RC circuit coupled to the additional comparator circuit;
wherein the third RC circuit and the fourth RC circuit are to increase bandwidth and reduce interference in the received signals processed by the additional comparator circuit.

8. The system of claim 6, wherein the first series RC circuit and the second series RC circuit each comprise an adjustable resistor and an adjustable capacitor.

9. The system of claim 6, wherein the first series RC circuit and the second series RC circuit each comprise a fixed resistor and a fixed capacitor.

10. The system of claim 6, wherein the circuitry is included in an interface of the memory component.

11. A method, comprising:
receiving, by a memory component of a memory sub-system, signals from a processing device of the memory sub-system;
processing, by a comparator circuit of the memory component, the received signals, wherein the comparator circuit includes:
a first transistor having a gate to which the received signals are coupled;
a second transistor having a gate to which a reference signal is coupled; and
a third transistor having a drain that is directly coupled to a drain of the second transistor;
reducing, by a series resistor-capacitor (RC) circuit directly coupled to a gate of the third transistor of the comparator circuit, interference in the received signals processed by the comparator circuit; and
increasing, by the series RC circuit directly coupled to the gate of the third transistor of the comparator circuit, bandwidth in the received signals processed by the comparator circuit.

12. The method of claim 11, wherein the method comprises increasing the bandwidth in the received signals by increasing, by the series RC circuit, a speed at which the comparator circuit processes the received signals.

13. The method of claim 12, wherein the method further comprises increasing the speed at which the comparator circuit processes the received signals by increasing a data rate operation of the comparator circuit.

14. The method of claim 11, wherein the received signals comprise voltage signals.

15. The method of claim 11, wherein processing the received signals comprises:
comparing, by the comparator circuit, the received signals to the reference signal; and
outputting, by the comparator circuit, a signal indicating a result of the comparison.

16. The method of claim 15, wherein outputting the signal indicating the result of the comparison comprises outputting the signal indicating the result of the comparison to a processing device of the memory component.

17. The method of claim 11, wherein reducing the interference in the received signals comprises reducing inter-symbol interference in the received signals.

* * * * *